United States Patent [19]

Miyazaki

[11] Patent Number: 5,250,323
[45] Date of Patent: Oct. 5, 1993

[54] CHEMICAL VAPOR GROWTH APPARATUS HAVING AN EXHAUST DEVICE INCLUDING TRAP

[75] Inventor: Shinji Miyazaki, Yokohama, Japan

[73] Assignee: Kabushiki Kaisha Toshiba, Kawasaki, Japan

[21] Appl. No.: 956,555

[22] Filed: Oct. 5, 1992

Related U.S. Application Data

[63] Continuation of Ser. No. 604,176, Oct. 29, 1990, abandoned.

[30] Foreign Application Priority Data

Oct. 30, 1989 [JP] Japan .................................. 1-279976

[51] Int. Cl.$^5$ .............................................. C23C 16/00
[52] U.S. Cl. ................................ 427/255.1; 118/715; 427/248.1
[58] Field of Search ............... 118/715, 50; 427/248.1, 427/255.1

[56] References Cited

U.S. PATENT DOCUMENTS 4,816,046  3/1989  Maebo et al. ........................ 204/164

FOREIGN PATENT DOCUMENTS 59-50165  3/1984  Japan ................... 118/715
62-7120   1/1987  Japan ................... 118/715
64-47872  2/1989  Japan .
WO86/06755 11/1986 PCT Int'l Appl. ......... 118/715
2008084   5/1979  United Kingdom .

OTHER PUBLICATIONS

Patent Abstracts of Japan, vol. 13, No. 238 (JP 1-47872) published Feb. 22, 1989.

*Primary Examiner*—Terry J. Owens
*Attorney, Agent, or Firm*—Foley & Lardner

[57] ABSTRACT

A chemical vapor growth apparatus comprises a process chamber for carrying out a chemical vapor growth process; source gas inlet for introducing at least one source gas to the process chamber from a gas source; source gas flow-rate controller for controlling the flow-rate of the source gas to be sent to the process chamber through the inlet; a first exhaust for exhausting the source gas remaining in the inlet and in the gas flow-rate controller, connected to the source gas inlet and the source gas flow-rate controller; a trap for absorbing the source gas remaining in the source gas inlet and the gas flow-rate controller, provided in the first exhaust; and a second exhaust for exhausting gases and particles generated by chemical reaction from the process chamber, the second exhaust being connected to the process chamber and to a vacuum pump.

11 Claims, 3 Drawing Sheets

CHEMICAL VAPOR GROWTH APPARATUS HAVING AN EXHAUST DEVICE INCLUDING TRAP

This application is a continuation of application Ser. No. 07/604,176, filed Oct. 29, 1990, now abandoned.

BACKGROUND OF THE INVENTION

1. Field of the Invention

The present invention relates to an apparatus for a chemical vapor growth method of a semiconductor device, and particularly to an apparatus for the chemical vapor growth method including gas process means for removing a source gas remaining in the apparatus with high efficiency.

2. Description of the Prior Art

FIG. 1 is a schematic diagram of a conventional apparatus for a chemical vapor growth of a semiconductor device.

The chemical vapor growth apparatus comprises a reaction tube 1, a flow rate control system 3 for supplying reactive gases in respectively predetermined amounts to the reaction tube 1 as a process chamber, a gas trap 5 connected to the outlet side of the reaction tube 1, an exhaust tube 6, a gate valve 7 and a vacuum pump 8.

The flow rate control system 3 comprises a plurality of mass-flow controllers 4.

Next, operation of the conventional chemical vapor growth apparatus having the above construction is explained.

In this case, a dichlorosilane ($SiH_2Cl_2$) gas and an ammonia ($NH_3$) gas are used as a source gas, and a nitrogen ($N_2$) gas is used as a purge gas.

In tubes except the reaction tube 1, for example, in a dichlorosilane gas supplying tube 9, a main gas line 10, a vacuum vent line 11, an air vent line 12 and a $N_2$ gas supply tube 13, when the dichlorosilane gas and the ammonia gas are mixed with each other, particles of powdery ammonium chloride are generated. Moreover, these particles attach to the inner walls of these tubes. The tubes are so clogged with these particles that the chemical vapor growth apparatus cannot work at all.

To avoid this problem in the prior art, after the reaction process is finished, the dichlorosilane gas is exhausted by using the $N_2$ gas supply tube 13 and the vacuum vent line 11, and then the ammonia gas is purged by the combination of the $N_2$ gas supply tube 13 and the vacuum vent line 11 a little after the purge process of dichlorosilane gas.

However, by this method, the source gas remaining in the mass-flow controllers 4 cannot be removed sufficiently.

Moreover, when other organic gases are used as the reaction gases, since it becomes necessary to probide large-scale heating means for heating the pipeline to prevent moisture condensation, the operation of the chemical vapor growth apparatus. Complicated techniques are required for chemical vapor growth occurring in the apparatus. In this case, the purge of gases remaining in the mass-flow controllers 4 is difficult.

In such a manner, when the remaining gas is not sufficiently purged, the particles as mentioned above are generated in the lines 10, 11, and 12 and the vacuum pump 8 respectively communicated with the mass-flow controllers 4. Accordingly, to avoid the generation of particles in the lines, a large-scale heating system must be required.

SUMMARY OF THE INVENTION

Therefore, it is an object of the present invention to provide a chemical vapor growth apparatus that removes the source gas remaining in the flow rate control system with high efficiency.

Accordingly, the present invention is characterized by a chemical vapor growth apparatus comprising a process chamber for carrying out a chemical vapor growth process, gas rate control means for mainly supplying gases to the process chamber in predetermined amounts, and gas process means for removing the gases in the apparatus provided at a portion of gas exhaust means installed in the gas flow rate control means.

In accordance with these and other objects of the invention, a chemical vapor growth apparatus is provided, which comprises a process chamber for carrying out a chemical vapor growth process; source gas introducing means for introducing at least one source gas to the process chamber from a gas source; source gas flow-rate control means for controlling the flow-rate of the source gas to be sent to the process chamber through the introducing means; a first exhaust means for exhausting the source gas remaining in the introducing means and in the gas flow-rate control means, connected to the source gas introducing means and the source gas flow-rate control means; a trap for absorbing the source gas remaining in the source gas introducing means and the gas flow-rate control means, provided in the first exhaust means; and a second exhaust means for exhausting gases and particles generated by chemical reaction from the process chamber, the second exhaust means being connected to the process chamber and to a vacuum pump.

For example, the gas process means is provided with a trap. Since the remaining gas is absorbed in an absorbent provided in the trap, reaction products such as chloride particles do not attach to the internal walls of the gas flow rate control means and the vacuum pump. Accordingly, a preferable chemical vapor growth process can be carried out.

These and other objects, feature and advantages of the present invention will be more apparent from the following description of preferred embodiments, taken in conjunction with the accompanying drawings.

DETAILED DESCRIPTION OF THE EMBODIMENTS

Hereinafter, the present invention will be described with reference to the drawings.

Figure 2:
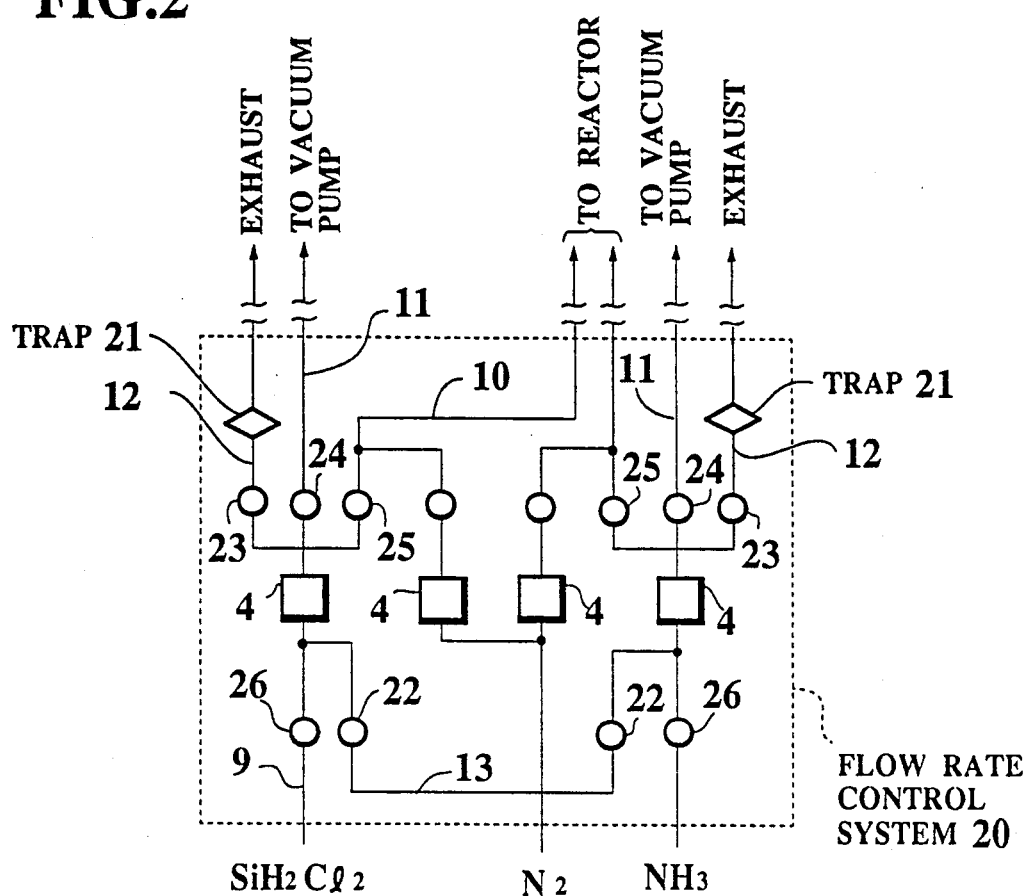
FIG. 2 is a partial constructional diagram of a chemical vapor growth apparatus which is an embodiment of the present invention.

FIG. 2 is a partial constructional diagram of a chemical vapor growth apparatus which is an embodiment of the present invention, and mainly shows gas flow rate control means, that is, a flow rate control system 20.

Figure 1:
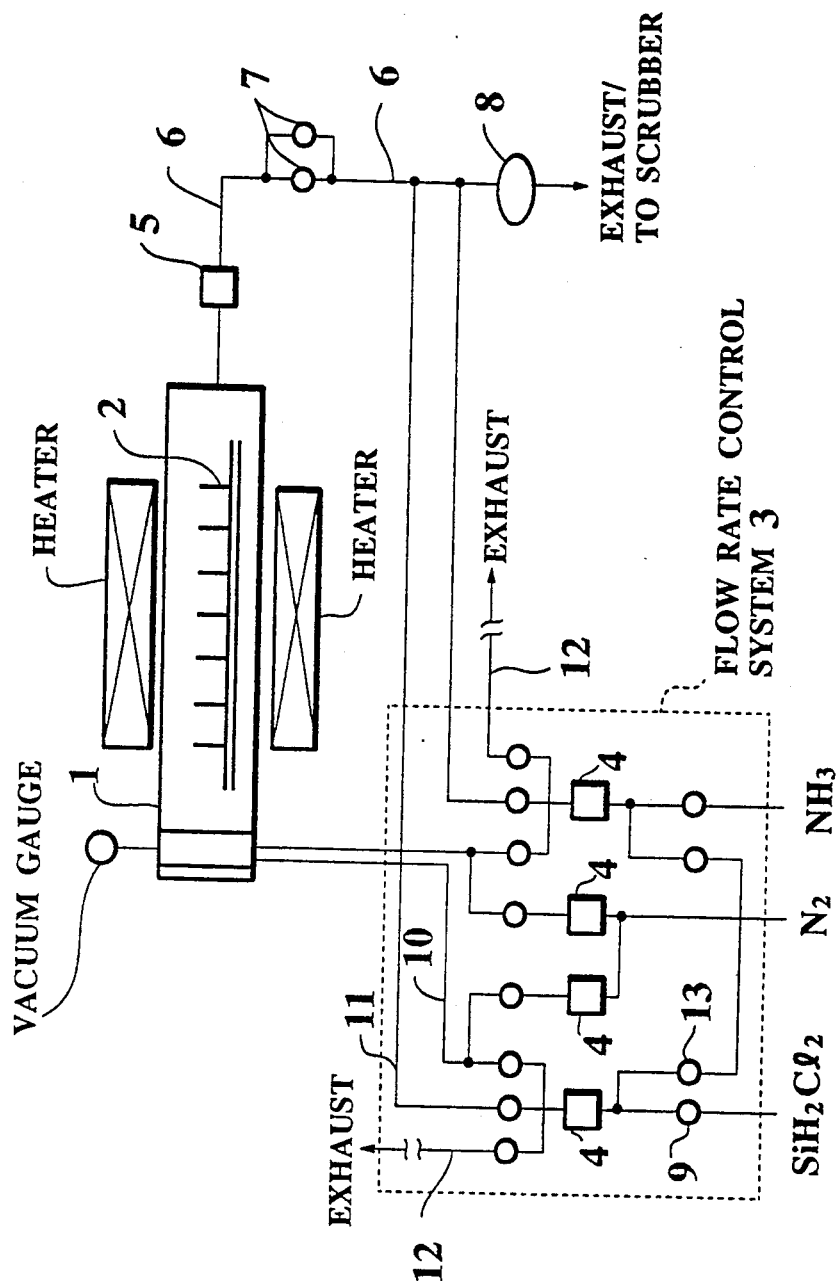
FIG. 1 is a constructional diagram of a conventional chemical vapor growth apparatus.

Incidentally, in the same diagram, the same constructional elements as those described in the conventional example as shown in FIG. 1 are designated by the same reference numerals.

In FIG. 2, reference numeral 20 designates the flow rate control system having a plurality of mass-flow controllers 4. Moreover, reference numeral 21 designates each gas process means, for example, a trap having an absorbent corresponding to kinds of gases to be used. Each trap 21 is provided at each exhaust means, that is, a portion of each of air vent lines 12. Except these parts, the other construction elements of the chemical vapor growth apparatus according to the present invention are the same as those in the conventional apparatus.

Hereinafter, operation of the chemical vapor growth apparatus of the embodiment having the above construction will be explained First, valves 22 and 23 are opened, and valves 24, 25 and 26 are closed.

Then, the interior of the mass-flow controllers 4 are purged with a $N_2$ gas.

Thereafter, the valves 22, 23, 25 and 26 are closed, at the same time, the valves 24 are opened, so as to remove a remaining gas through vacuum vent lines 11.

After the process, the valves 24 are closed, then the valves 25 and 26 are opened to supply source gases, for example a dichlorosilane ($SiH_2Cl_2$), in the mass-flow controllers 4. At the time, the gas flow rate is controlled by the mass-flow controllers 4, and a reaction tube (not shown) is heated under reduced pressure by a heater element (not shown). As the result, a chemical vapor growth process is carried out in the reaction tube 1.

After the chemical vapor growth process, the valves 22 and 23 are opened, and 24, 25 and 26 are closed to introduce the $N_2$ gas in the pipeline to purge the source gas. At the time, the source gas is absorbed in the traps 21 by the absorbent provided therein. Thereafter, the valves 23 are closed and the valves 24 are opened so as to carry out the gas purge by the vacuum vent lines 11. At the time, since the source gas is removed by the absorption in the trap 21, the pipeline is filled with the $N_2$ gas.

As stated above, since the flow rate control system 20 in the chemical vapor growth apparatus of this embodiment comprises the traps 21, the source gas does not flow into a vacuum pump (not shown) through the vacuum vent lines 11 or remain in the mass-flow controllers as in the conventional apparatus.

Accordingly, the problem can be avoided in which source gases remaining in the pipeline, for example a dichlorosilane gas and an ammonia gas, are mixed therein, and particles of powdery ammonium chloride are produced, so that the pipeline is stopped by attachment of the particles to the inner walls. As the result, accumulation of the chloride particles on the inner walls of the flow rate control system and the vacuum pump can be prevented.

Figure 3:
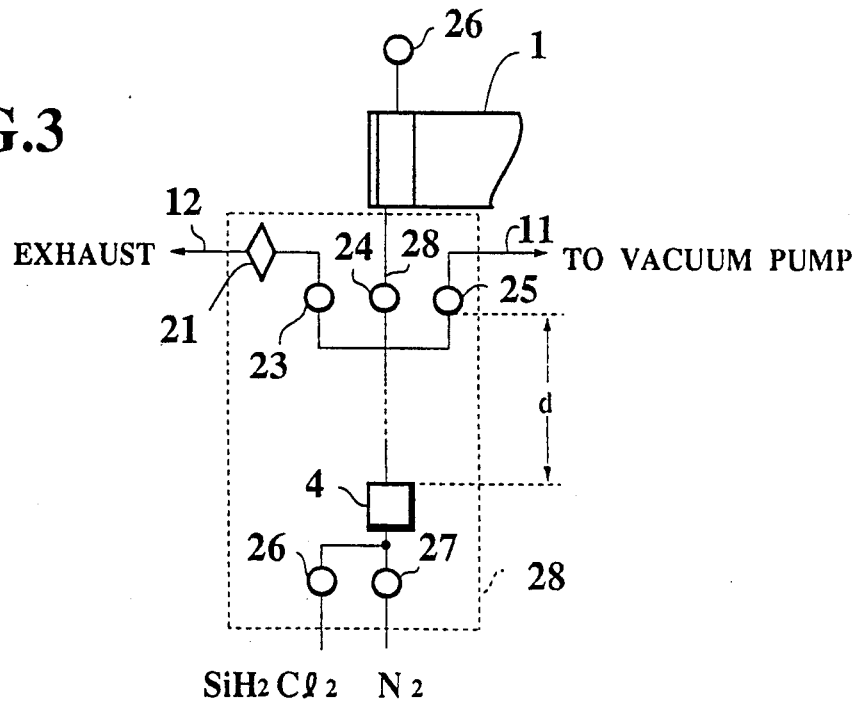
FIG. 3 is a partial constructional diagram of a chemical vapor growth apparatus which is another embodiment of the present invention.

FIG. 3 is a partial construction diagram of a chemical vapor growth apparatus which is another embodiment of the present invention.

In a flow rate control system 28 of this embodiment, a trap 21 is provided near to a reaction tube 1 as compared with the conventional apparatus by extending a piping distance "d" from an outlet of a mass-flow controller 4 to valves 23, 24, and 25. Moreover, by shortening the distance from the valves 23, 24 and 25 to the reaction tube 1, gas purge by using a $N_2$ gas can be carried out at any time under vacuum through a vacuum vent line 11. Accordingly, the purge efficiency of the mass-flow rate controller 4 and the flow rate control system 28 can be further improved.

Figure 4:
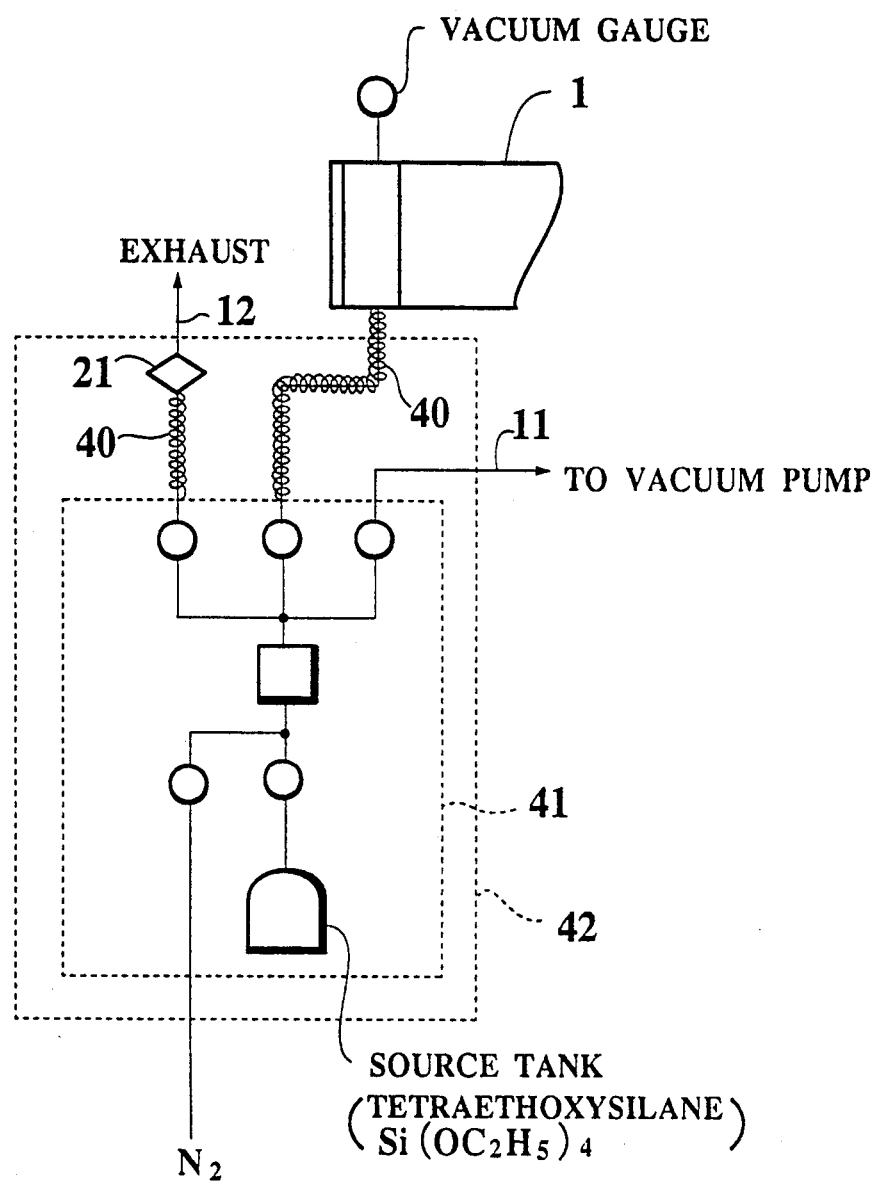
FIG. 4 is a partial constructional diagram of a chemical vapor growth apparatus which is still another embodiment of the present invention.

FIG. 4 shows still another embodiment in which the present invention is applied to a chemical vapor growth apparatus using an organic type source gas for instance, a tetraethoxysilane $Si(OC_2H_5)_4$ gas. As explained in the conventional apparatus, when the tetraethoxysilane ($Si(OC_2H_5)_4$) gas as the source gas of organic series is used, it is necessary to provide a heating system 40 and a constant-temperature chamber 41 to prevent moisture condensation. The source gas of organic series is likely to generate reaction products so that the attachment of reaction products to a vacuum pump (not shown) and an air vent line 12 is likely to be caused as compared with inorganic gases. Particularly, when the products attach to the vacuum pump, the life-span of the pump is reduced.

In a flow rate control system 42 of this embodiment, as described in the embodiments of FIGS. 2 and 3, a trap 21 is provided in the course of the air vent line 12. As the result, the heating system to be provided in the vacuum vent line 11 becomes unnecessary, so that the construction of the chemical vapor growth system is simplified.

Incidentally, in these embodiments, though the gas purge is explained with respect to the case after the reaction formation process in the reaction tube 1, this invention is not limited thereto, and it is possible to apply this invention to a process in which the flow rate control of a source gas is carried out by mass flow controller without flowing it into the reaction tube. In this case, it is also possible to remove the source gas of a high concentration by a trap.

Various modification will become possible for those skilled in the art after receiving the teachings of the present disclosure without departing from the scope thereof.

What is claimed is:

1. A chemical vapor growth apparatus comprising:
   a process chamber for carrying out a chemical vapor growth process;
   source gas introducing means for introducing at least one source gas to the process chamber from a gas source;
   source gas flow-rate control means for controlling the flow-rate of the source gas to be sent to the process chamber through the source gas introducing means;
   first exhaust means for exhausting the source gases remaining in the introducing means and in the source gas flow-rate control means, connected to the source gas introducing means and the source gas flow-rate control means;
   trap means for absorbing the source gas remaining in the source gas introducing means and the source gas flow-rate control means, provided in the first exhaust means;
   second exhaust means for exhausting gases and particles generated by chemical reaction from the process chamber, the second exhaust means being connected to the process chamber and to a vacuum pump; and
   purge gas introducing means connected to the source gas introducing means and the gas flow-rate control means for introducing a purge gas into the source gas introducing means and the gas flow-rate control means, and a valve and mass flow-rate control means for controlling the flow of purge gas, wherein the first and second exhaust means are separate exhaust means.

2. A chemical vapor growth apparatus as recited in claim 1, wherein the valve is located between the mass flow-rate control means and the first exhaust means.

3. A chemical vapor growth apparatus as recited in claim 1, wherein the mass flow-rate control means is located between the valve and the first exhaust means.

4. A chemical vapor growth apparatus as recited in claim 1, comprising a plurality of source gas introducing means.

5. A chemical vapor growth apparatus as recited in claim 1, comprising a single source gas introducing means.

6. A chemical vapor growth apparatus as recited in claim 1, consisting essentially of the recited components.

7. A chemical vapor growth apparatus as recited in claim 5, consisting essentially of the recited components.

8. A method for growing a chemical vapor deposition layer on a semiconductor substrate, comprising the steps of:

placing a semiconductor substrate in a process chamber for carrying out a chemical vapor growth process;

introducing at least one source gas to the process chamber through a source gas introducing means, a flow rate of the at least one source gas being controlled by a source gas flow-rate control means through which the source gas is introduced;

depositing a film on the semiconductor substrate from the at least one source gas;

exhausting gases and particles generated by chemical reaction from the process chamber through a process chamber exhaust means, said process chamber exhaust means being connected to the process chamber and to a vacuum pump; and exhausting the at least one source gas remaining in the source gas introducing means and in the source gas flow-rate control means through a source gas exhaust means which is separate from the process chamber exhaust means and connected to the source gas introducing means and the source gas flow-rate control means, the source gas exhaust means including a trap means for absorbing the source gas remaining in the source gas introducing means and the source gas flow-rate control means, the exhausting being carried out by introducing a purge gas through a purge gas introducing means connected to the source gas introducing means and to the source gas flow-rate control means, wherein generation of particles in the source gas introducing means and the source gas flow-rate control means is prevented.

9. A method as claimed in claim 8, wherein dichlorosilane and ammonia are used as source gases.

10. A method as claimed in claim 9, wherein the purge gas is nitrogen.

11. A method as claimed in claim 10, wherein the trap means contains an absorbent that is selected based on a composition of the source gas.

* * * * *